United States Patent
Ouyang et al.

(10) Patent No.: US 9,996,006 B2
(45) Date of Patent: *Jun. 12, 2018

(54) RESIST SENSITIVITY AND PROFILE IMPROVEMENT VIA ACID ANION CONTROL DURING FIELD-GUIDED POST EXPOSURE BAKE

(71) Applicant: Applied Materials, Inc., Santa Clara, CA (US)

(72) Inventors: Christine Y. Ouyang, Santa Clara, CA (US); Sang Ki Nam, Danville, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/294,348

(22) Filed: Oct. 14, 2016

(65) Prior Publication Data
US 2018/0107117 A1    Apr. 19, 2018

(51) Int. Cl.
| G03F 7/38 | (2006.01) |
| G03F 7/20 | (2006.01) |
| G03F 7/004 | (2006.01) |
| G03F 7/32 | (2006.01) |

(52) U.S. Cl.
CPC .......... *G03F 7/203* (2013.01); *G03F 7/0045* (2013.01); *G03F 7/2004* (2013.01); *G03F 7/325* (2013.01)

(58) Field of Classification Search
CPC .............. G03F 7/70341; G03F 7/0045; G03F 7/70658; G03F 7/3007
USPC .......................................................... 430/330
See application file for complete search history.

(56) References Cited

U.S. PATENT DOCUMENTS

| 5,258,266 A | 11/1993 | Tokui et al. |
| 5,731,123 A | 3/1998 | Kawamura et al. |
| 6,376,152 B2 | 4/2002 | Kawabe et al. |
| 6,686,132 B2 | 2/2004 | Cheng et al. |
| 6,841,342 B2 * | 1/2005 | Nishi ........................ G03F 7/38 118/302 |
| 7,318,997 B2 | 1/2008 | Kim et al. |
| 7,374,867 B2 | 5/2008 | Bristol et al. |
| 8,097,402 B2 | 1/2012 | Scheer et al. |
| 2011/0164234 A1 * | 7/2011 | Wang ................... G03F 7/0045 355/67 |

* cited by examiner

*Primary Examiner* — Daborah Chacko-Davis
(74) *Attorney, Agent, or Firm* — Patterson + Sheridan LLP

(57) ABSTRACT

Methods disclosed herein provide apparatus and methods for applying an electric field and/or a magnetic field to a photoresist layer without air gap intervention during photolithography processes. In one embodiment, an apparatus includes a processing chamber configured to apply an electric field to a substrate via a non-gas phase intermediate medium. Methods described herein include dissociation of a photoacid generator to generate anions and cations. The anions may be moved within the photoresist layer by the electric field to more precisely control the speed and location of acid generation and regeneration processes.

20 Claims, 10 Drawing Sheets

US 9,996,006 B2

RESIST SENSITIVITY AND PROFILE IMPROVEMENT VIA ACID ANION CONTROL DURING FIELD-GUIDED POST EXPOSURE BAKE

BACKGROUND

Field

The present disclosure generally relates to methods and apparatus for processing a substrate, and more specifically to methods and apparatus for improving photolithography processes.

Description of the Related Art

Integrated circuits have evolved into complex devices that can include millions of components (e.g., transistors, capacitors and resistors) on a single chip. Photolithography is a process that may be used to form components on a chip. Generally the process of photolithography involves a few basic stages. Initially, a photoresist layer is formed on a substrate. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, for example, a 193 nm ArF laser, an electron beam, an ion beam, or other suitable source. Excess solvent may then be removed in a pre-exposure bake process.

In an exposure stage, a photomask or reticle may be used to selectively expose certain regions of the substrate to electromagnetic radiation. Other exposure methods may be maskless exposure methods. Exposure to light may decompose the photo acid generator, which generates acid and results in a latent acid image in the resist resin. After exposure, the substrate may be heated in a post-exposure bake process. During the post-exposure bake process, the acid generated by the photoacid generator reacts with the resist resin, changing the solubility of the resist during the subsequent development process.

After the post-exposure bake, the substrate, and, particularly, the photoresist layer may be developed and rinsed. Depending on the type of photoresist used, regions of the substrate that were exposed to electromagnetic radiation may either be resistant to removal or more prone to removal. After development and rinsing, the pattern of the mask is transferred to the substrate using a wet or dry etch process.

The evolution of chip design continually requires faster circuitry and greater circuit density. The demands for greater circuit density necessitate a reduction in the dimensions of the integrated circuit components. As the dimensions of the integrated circuit components are reduced, more elements are required to be placed in a given area on a semiconductor integrated circuit. Accordingly, the lithography process must transfer even smaller features onto a substrate, and lithography must do so precisely, accurately, and without damage. In order to precisely and accurately transfer features onto a substrate, high resolution lithography may use a light source that provides radiation at small wavelengths. Small wavelengths help to reduce the minimum printable size on a substrate or wafer. However, small wavelength lithography suffers from problems, such as low throughput, increased line edge roughness, and/or decreased resist sensitivity.

In a recent development, an electrode assembly is utilized to generate an electric field to a photoresist layer disposed on the substrate prior to or after an exposure process so as to modify chemical properties of a portion of the photoresist layer where the electromagnetic radiation is transmitted to for improving lithography exposure/development resolution. However, the challenges in implementing such systems have not been.

Therefore, there is a need for improved methods and apparatus for improving photolithography processes.

SUMMARY

In one embodiment, a photolithography method is provided. The method includes exposing a substrate having a photoresist layer disposed thereon to electromagnetic radiation. The photoresist layer may include a photoacid generator and the photoresist layer may be ionized. The method also includes dissociating the photoacid generator to form anions and cations in a first resist region and facilitating acid generation by protonating the anions in the first resist region by applying an electromagnetic field to the substrate to move the anions within the photoresist layer to a second resist region. In addition, the method includes facilitating acid generation by protonating the anions in the second resist region.

In another embodiment, a photolithography method is provided. The method includes exposing a substrate having a photoresist layer disposed thereon to extreme ultraviolet radiation. The photoresist layer may include a photoacid generator and the photoresist layer may be ionized. The method also includes dissociating the photoacid generator to for anions and cations in a first resist region adjacent an exposed surface of the photoresist layer, heating the substrate and the photoresist layer, and facilitating acid generation by protonating the anions in the first resist region. Applying an electromagnetic filed to the substrate is performed via a non-gas phase medium to move the anions within the photoresist layer to a second resist region different than the first resist region. The method also includes facilitating acid generation by protonating the anions in the second resist region.

In yet another embodiment, a substrate processing method is provided. The method includes applying a photoresist to a substrate in a first processing chamber and transferring the substrate via a first transfer chamber to a second processing chamber. The substrate is heated in the second processing chamber and the substrate is transferred via a second transfer chamber to a third processing chamber. The substrate is exposed to extreme ultraviolet radiation in the third processing chamber and the substrate is transferred via a third transfer chamber to a fourth processing chamber. The second processing chamber and the fourth processing chamber may be configured similarly and an electric field may be applied to the substrate via a non-gas phase medium to cause movement of anions within the photoresist in the fourth processing chamber. The substrate is transferred via a fourth transfer chamber to a fifth processing chamber where the photoresist on the substrate is developed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Methods and apparatus for minimizing line edge/width roughness and improving exposure resolution in a photolithography process for semiconductor applications are provided. The methods and apparatuses disclosed herein may increase the photoresist sensitivity and productivity of photolithography processes. The random diffusion of acids generated by a photoacid generator during a post-exposure bake procedure contributes to line edge/width roughness and reduced resist sensitivity. An electrode assembly may be utilized to apply an electric field and/or a magnetic field to the photoresist layer during photolithography processes. The field application may control the diffusion of the charged species generated by the photoacid generator.

An air gap defined between the photoresist layer and the electrode assembly may result in voltage drop applied to the electrode assembly, thus, adversely lowering the level of the electric field desired to be generated to the photoresist layer. As a result of the voltage drop, levels of the electric field at the photoresist layer may result in insufficient or inaccurate voltage power to drive or create charged species in the photoresist layer in certain desired directions. Thus, diminished line edge profile control to the photoresist layer may prevalent.

An intermediate medium may be disposed between the photoresist layer and the electrode assembly to prevent the air gap from being created so as to maintain the level of the electric field interacting with the photoresist layer at a certain desired level. By doing so, the charged species generated by the electric field may be guided in a desired direction along the line and spacing direction, preventing the line edge/width roughness that results from inaccurate and random diffusion. Accordingly, a controlled or desired level of electric field as generated may increase the accuracy and sensitivity of the photoresist layer to exposure and/or development process. In one example, the intermediate medium may be non-gas phase medium, such as a slurry, gel, liquid solution or a solid state medium that may efficient maintain voltage level as applied at a determined range when transmitting from the electrode assembly to the photoresist layer disposed on the substrate.

Figure 1:
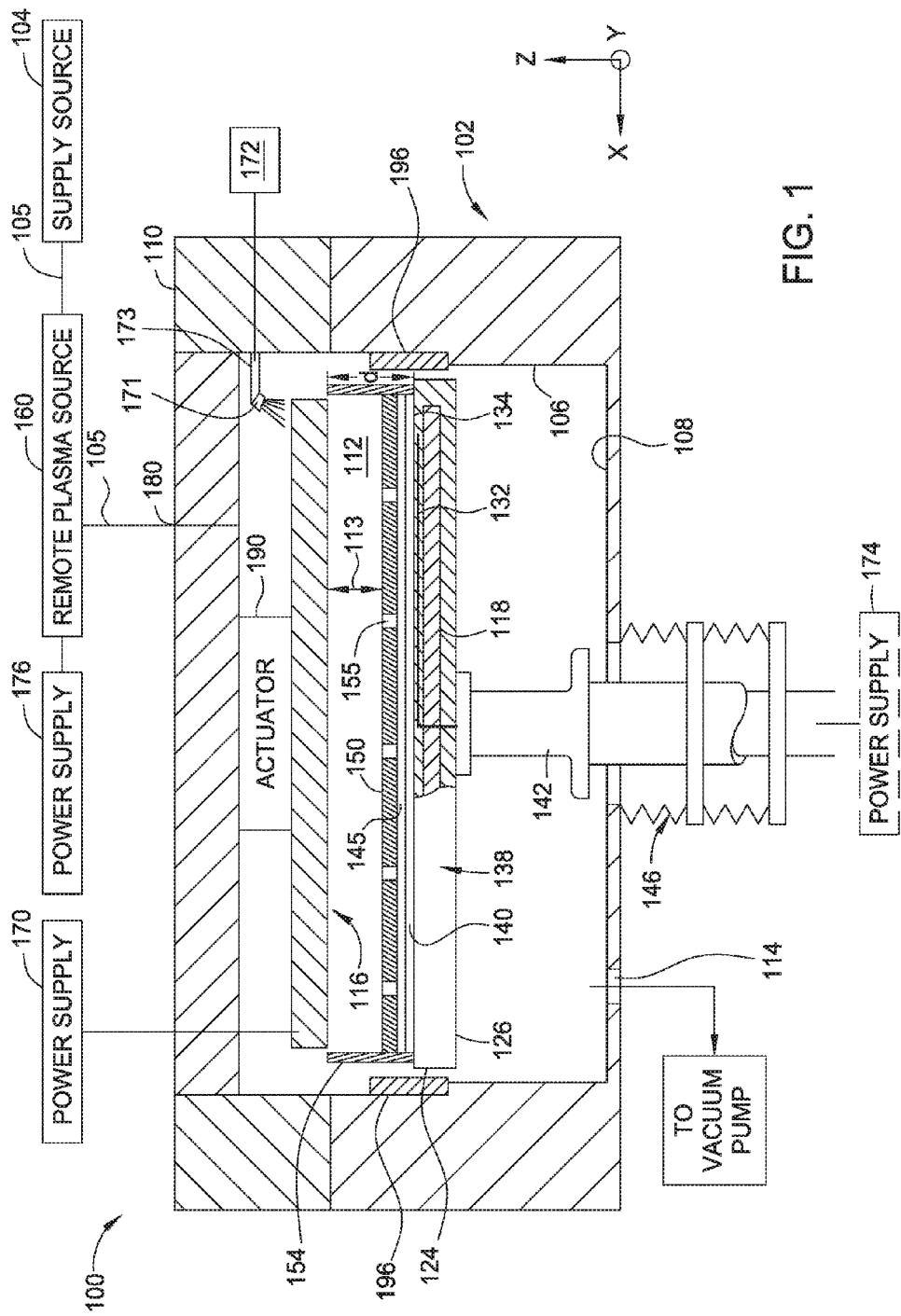
FIG. 1 illustrates a schematic cross-sectional view of an apparatus for processing a substrate according to one embodiment described herein.
Figure 6:
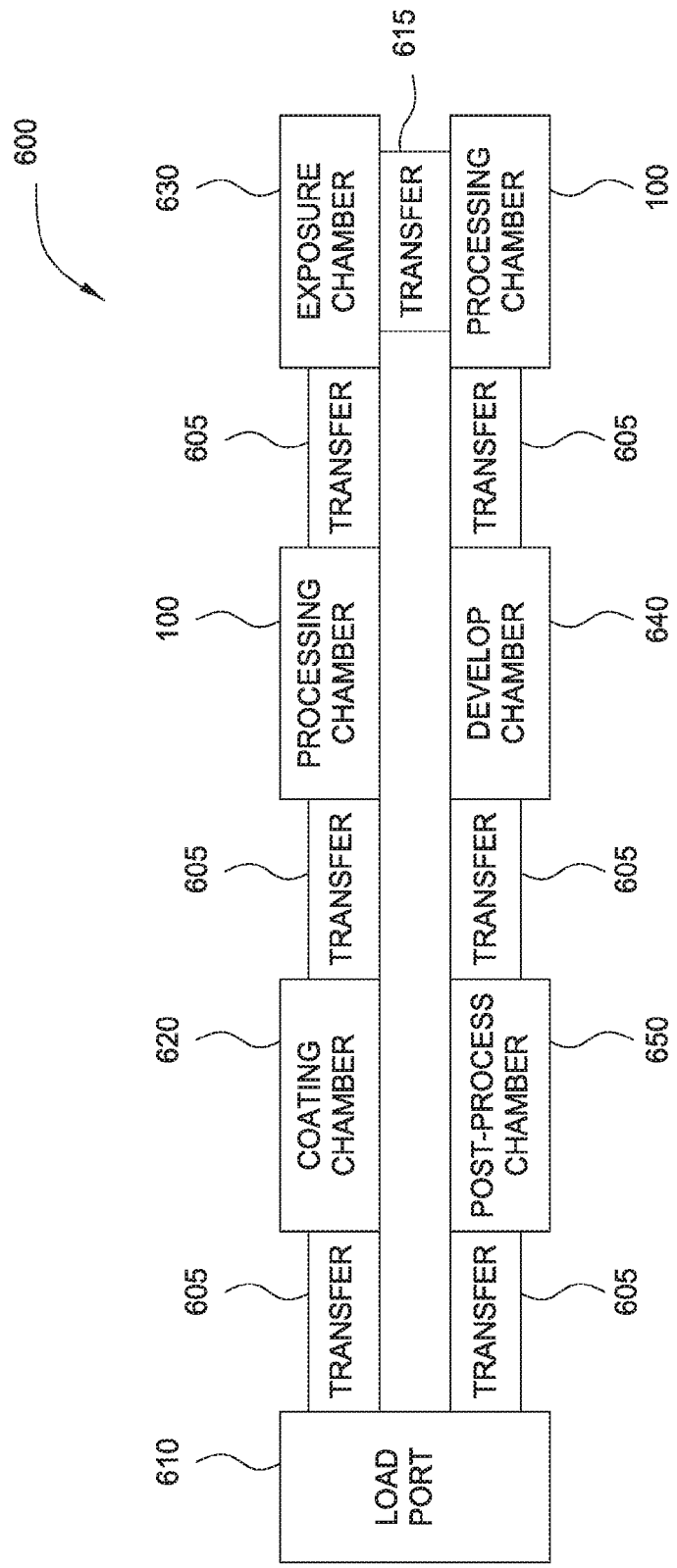
FIG. 6 illustrates a schematic illustration of one representative cluster processing system that may be used to process a substrate according to embodiments disclosed herein.

FIG. 1 illustrates a schematic, cross-sectional view of an substrate processing chamber 100. In one embodiment, the processing chamber 100 is a vacuum processing chamber. In other embodiments, the processing chamber 100 may not be coupled to a vacuum source and may be operated at predominantly atmospheric pressures. The processing chamber 100 may be an independent processing chamber or may be part of a processing system, such as, for example, an in-line processing system, a cluster processing system, or a track processing system such as shown in FIG. 6 discussed further below.

The processing chamber 100 includes a chamber body 102, an electrode assembly 116, and a substrate support assembly 138. The chamber walls 102 include sidewalls 106, a lid assembly 110, and a bottom 108. The chamber body 102 at least partially (or entirely) encloses a processing volume 112. The processing volume 112 is accessed through a substrate transfer port (not shown) formed through the chamber body 102. The substrate transfer port is configured to facilitate movement of a substrate 140 into and out of the processing volume 112 of the processing chamber 100. In embodiments where the processing chamber 100 is part of a processing system, the substrate transfer port may allow for the substrate 140 to be transferred to and from a transfer chamber.

A pumping port 114 is disposed through the chamber body 102 to couple the processing volume 112 to a pumping system. The pumping system includes various vacuum pumping and flow control components, such as a vacuum pump and throttle valve. The pumping components may reduce the pressure of the processing volume 112 and exhaust any gases and/or process by-products out of the processing chamber 100.

The substrate support assembly 138 is centrally disposed within the processing chamber 100. The substrate support assembly 138 supports the substrate 140 during processing. The substrate support assembly 138 may comprise a body 124 that encapsulates an optional electrode assembly 118. The body 124 may comprise, for example, a metal, such as aluminum, or a ceramic material. In embodiments where the body 124 comprises a metal, the electrode assembly 118 may be encapsulated within an insulating material (not shown) that insulates the electrode assembly 118 from the metal body 124. The electrode assembly 118 may be coupled to a power supply 174. In other embodiments, the electrode assembly 118 may be coupled to ground. In some embodiments, the electrode assembly 118 is configured to generate an electric field parallel to the x-y plane defined by a first surface 134 of the substrate support assembly 138. For example, the electrode assembly 118 may be configured to generate an electric field in one of the y direction, x direction or other direction in the x-y plane. In other embodiments, the electrode assembly 118 is configured to generate an electric field perpendicular to the x-y plane defined by the first surface 134 of the substrate support assembly 138.

The substrate support assembly 138 also has a second surface 126 that is opposite the first surface 134. The first surface 134 is configured to support the substrate 140. The second surface 126 is coupled by a stem 142 to an actuator (not shown), which may be configured move the substrate 140 to and from a processing position. The first surface 134 of the substrate support assembly 138 is configured to support the substrate 140 during processing.

The substrate 140 may be any type of substrate, such as a dielectric substrate, a glass substrate, a semiconductor substrate, or a conductive substrate. The substrate 140 may have a layer 145 disposed thereon. The layer 145 may be any desired layer and the substrate 140 may have more than one layer 145 disposed therein. Generally, the layer 145 may include semiconductor device features, components, and precursors thereof. The substrate 140 also has a photoresist layer 150 disposed over the layer 145.

The substrate 140 may have been previously exposed to electromagnetic radiation in an exposure stage of a photolithography process. In one embodiment, the substrate 140 may be exposed to electromagnetic radiation in a separate chamber or the processing chamber 100. The photoresist layer 150 generally has latent image lines 155 formed therein as a result of the exposure stage. The latent image lines 155 may be substantially parallel. In other embodiments, the latent image lines 155 may not be substantially parallel, such as perpendicular or the like depending on a desired device architecture.

In some embodiments, the substrate support assembly 138 may be an electrostatic chuck. In some embodiments, the body 124 of the substrate support assembly 138 may encapsulate an embedded heater 132. The embedded heater 132, such as a resistive element, is disposed in the substrate support assembly 138. The embedded heater 132 controllably heats the substrate support assembly 138 and the substrate 140 positioned thereon to a predetermined temperature. The embedded heater 132 is configured to quickly ramp the temperature of the substrate 140 and to control the temperature of the substrate 140. In some embodiments, the embedded heater 132 is connected to and controlled by the power supply 174. The power supply 174 may be configured similarly to the power supply 170, as discussed below.

In some embodiments, the processing chamber 100 may include other heating sources. For example, heat lamps may be positioned within or outside the processing chamber 100. In some embodiments, one or more lasers may be used to heat the photoresist layer 150 (or other layer) positioned on the substrate 140 or the antennas 220, 221 of the electrode assembly 116 (shown in FIG. 2). In some embodiments, the substrate support assembly 138 may be configured to circulate a high efficiency heat transfer fluid in order to more quickly increase the temperature of the substrate 140 positioned on the substrate support assembly 138.

In some embodiments, the substrate support assembly 138 may be configured to provide relative motion between the first surface 134 (and the substrate 140 positioned thereon) and the electrode assembly 116. For example, the substrate support assembly 138 may be configured to rotate about the z-axis. The substrate support assembly 138 may be configured to continuously rotate, or the substrate support assembly 138 may be configured to rotate in a step-wise manner. For example, the substrate support assembly 138 may rotate a predetermined amount of degrees about a centerline of the substrate support assembly 138, such as about 90°, about 180°, or about 270°. The rotation may be stopped for a predetermined amount of time at any stage of the rotation. After the predetermined amount of time, the rotation may continue in a step-wise manner or in a continuous manner.

The substrate support assembly 138 may be configured to move vertically (i.e., in the z-direction). The substrate support assembly 138 may also be separated from the electrode assembly 116. For example, the substrate support assembly 138 and the electrode assembly 116 may be separated by a distance of at least about 0.1 mm. A confinement ring 154 is disposed on an edge of the substrate support assembly 138 circumscribing the substrate support assembly 138 defining a distance d in the z-direction between the first surface 134 of the substrate support assembly 138 and the electrode assembly 116. The confinement ring 154 may assist maintaining the substrate 140 positioned at a desired location on the first surface 134 of the substrate support assembly 138.

The confinement ring 154 may also confine an intermediate medium, i.e., a non-gas phase medium, such as solid slurry, a gel and/or liquid medium, disposed in the processing volume 112 above the photoresist layer 150. In one example, the confinement ring 154 may have a length, i.e., the defined distance d, between about 0.5 mm and about 10 mm, sufficient to retain the intermediate medium at a level that covers an entire surface of the photoresist layer 150 disposed on the substrate 140 when the intermediate medium is disposed in the processing volume 112. Alternatively, the confinement ring may be disposed on an edge of the electrode assembly 116 and extend toward an edge of the substrate support assembly 138 to assist positioning of the substrate 140. In one example, the confinement ring 154 may be manufactured from a ceramic material, conductive material, dielectric material, or other suitable material that is chemically inert to the intermediate medium.

In one example, an intermediate medium dispensing tool 173 is disposed through the chamber body 102 and into the processing chamber 100. The intermediate medium dispensing tool 173 generally includes a nozzle 171 configured to dispense intermediate medium to the region of the processing volume 112 confined by the confinement ring 154 above the substrate 140. The intermediate medium dispensing tool 173 is coupled to an intermediate medium source 172. Suitable examples of the intermediate medium includes any suitable liquid, such as water, organic gel, organic resin, organic slurry, organic solution, inorganic solution, inorganic gel, slurry, or the like, or any solid material that may be easily melted and later re-solidified to cover substantially an entire surface of the substrate 140. Generally, the intermediate medium may be a material with a dielectric constant greater than the dielectric constant of air. Details regarding the intermediate medium that may be used will be described later with reference to FIGS. 4A-5B.

The stem 142 is coupled to a lift system (not shown) for moving the substrate support assembly 138 between an elevated processing position (as shown) and a lowered substrate transfer position. In some embodiments, the lift system may also be configured to move the substrate 140 in the x-direction, the y-direction, or the x-direction and the y-direction. The stem 142 additionally provides a conduit for electrical and thermocouple leads between the substrate support assembly 138 and other components of the processing chamber 100. A bellows 146 is coupled to the substrate support assembly 138 to provide a vacuum seal between the processing volume 112 and the atmosphere outside the processing chamber 100, and facilitate movement of the substrate support assembly 138 in the z-direction.

The lid assembly 110 may optionally include an inlet 180 through which gases provided by supply sources 104 may enter the processing chamber 100. The supply sources 104 may optionally controllably pressurize the processing volume 112 with a gas, such as nitrogen, argon, helium, hydrogen, neon, chlorine, other gases, or combinations thereof. The gases from the supply sources 104 may create a controlled environment (i.e. desired concentrations of various gases) within the processing chamber 100. In other embodiments, the gases from the supply sources 104 may be used to generate a plasma. For example, the plasma may be generated in a remote plasma source 160. The supply sources 104 may couple directly to the processing volume 112 through a supply conduit 105. In some embodiments, the one or more source compounds may indirectly flow into the processing volume 112. As shown, the one or more source compounds first flow through the remote plasma source 160 before flowing into the processing volume 112.

The remote plasma source 160 may be configured to provide charged species, such as electrons, ions, radicals or the like, into the processing volume 112. The remote plasma source may be, for example, a capacitively coupled plasma source or an inductively coupled source. The remote plasma source 160 is coupled to a power supply 176 which may be, for example, an RF power supply. The power supply 176 may be configured to deliver power at a frequency of 10 Hz and about 1 MHz, such as about 5 kHz. In other embodiments, the power supply 176 may be configured to deliver power at 13.56 MHz. The power supply 176 and the remote plasma source 160 may be configured to generate a "soft" plasma. For example, the generated plasma may contain charged species having an ion energy of between about 1 eV and about 1000 eV, such as between about 5 eV and about 50 eV. In some embodiments, the ion energy may be between about 1 eV and about 5 eV. Electrons in the soft plasma may be used to drive the charged species 255 (shown in FIGS. 2A and 2B) generated from the photoacid generator in a direction perpendicular to the plane of the first surface 134. Driving the charged species in the z-direction may increase resist sensitivity.

In a representative example using a 300 mm substrate, the soft plasma may be generated as follows. It is contemplated that the gas flows may be scaled proportionately to the substrate diameter. Hydrogen gas may be provided into the remote plasma source 160 at a flow rate of between about 10 sccm and about 1000 sccm. Argon may optionally be flowed into the remote plasma source 160 at a flow rate of up to about 1000 sccm. A plasma may be generated in the remote plasma source 160 from inductively coupled RF power of between about 400 W and about 800 W. The pressure of the processing volume 112 may reduced to at least $10^{-5}$ Torr. For example, the pressure may be reduced to between about $10^{-6}$ Torr and about $10^{-8}$ Torr. The temperature of the substrate support assembly 138 may be maintained from room temperature to about 200° C., such as between about 70° C. and about 160° C., for example between about 90° C. and 140° C. as needed.

An actuator 190 may be coupled between the lid assembly 110 and the electrode assembly 116 to provide relative motion between the electrode assembly 116 and the substrate support assembly 138. The actuator 190 may be configured to move the electrode assembly 116 in one or more of the x, y, and z directions. The x and y directions are referred to herein as the lateral directions or dimensions. The actuator 190 enables the electrode assembly 116 to scan the surface of the substrate 140. The actuator 190 also enables the distance d to be adjusted. In some embodiments, the electrode assembly 116 is coupled to the lid assembly 110 by a fixed stem (not shown). In some embodiments, the actuator 190 is configured to rotate the electrode assembly 116 about z-axis. In other embodiments, the electrode assembly 116 may be coupled to the inside of the bottom 108 of the processing chamber 100, to the second surface 126 of the substrate support assembly 138, or to the stem 142.

The electrode assembly 116 generally includes one or more electrodes. The electrode assembly 116 is coupled to the power supply 170. In embodiments where the electrode assembly 116 includes more than one electrode, each electrode may be connected to a separate power supply. In some embodiments, the electrode assembly 116 is configured to generate an electric field parallel to the x-y plane defined by the first surface 134 of the substrate support assembly 138. For example, the electrode assembly 116 may be configured to generate an electric field in one of the y direction, x direction or other direction in the x-y plane. In one embodiment, the electrode assembly 116 is configured to generate an electric field in the x-y plane and in the direction of the latent image lines 155. In another embodiment, the electrode assembly 116 is configured to generate an electric field in the x-y plane and perpendicular to the direction of the latent image lines 155. The electrode assembly 116 may additionally or alternatively be configured to generate an electric field in the z-direction, such as, for example, perpendicular to the first surface 134.

The power supply 170 and/or the power supply 174 may be configured to supply, for example, between about 1 V and about 100 kV to one or more electrodes of the electrode assembly 116 and/or the electrode assembly 118. In one embodiment, the power supply may be configured to generate an electric field having a voltage potential between about 40 V and about 4,000 V. In some embodiments, the power supply 170 and/or the power supply 174 are a continuous or pulsed direct current (DC) power supply or a continuous or pulsed AC power. The pulsed DC wave or AC wave may be from a half-wave rectifier or a full-wave rectifier. The power supply 170 and/or the power supply 174 may be configured to provide power at a frequency of between about 10 Hz and about 1 MHz, such as about 5 kHz. The duty cycle of the pulsed DC power or AC power may be between about 5% and about 95%, such as between about 20% and about 60%. In some embodiments, the duty cycle of the pulsed DC power or AC power may be between about 20% and about 40%. In other embodiments, the duty cycle of the pulsed DC power or AC power may be about 60%.

The rise and fall time of the pulsed DC power or AC power may be between about 1 ns and about 1000 ns, such as between about 10 ns and about 500 ns. In other embodiments, the rise and fall time of the pulsed DC power or AC power may be between about 10 ns and about 100 ns. In some embodiments, the rise and fall time of the pulsed DC power or AC power may be about 500 ns. In some embodiments, the power supply 170 and/or the power supply 174 is an alternating current power supply. In other embodiments, the power supply 170 and/or the power supply 174 is a direct current power supply.

As shown, the electrode assembly 116 spans approximately the width of the substrate support assembly 138. In other embodiments, the width of the electrode assembly 116 may be less than that of the substrate support assembly 138. For example, the electrode assembly 116 may span between about 10% to about 80%, such as about 20% and about 40%, of the width of the substrate support assembly 138. In embodiments where the width of the electrode assembly 116 is shorter than the width of the substrate support assembly 138, the actuator 190 may scan the electrode assembly 116 across the surface of the substrate 140 positioned on the first surface 134 of the substrate support assembly 138. For example, the actuator 190 may scan such that the electrode assembly 116 scans the entire surface of the substrate 140. In other embodiments, the actuator 190 may scan only certain portions of the substrate 140. Alternatively, the substrate support assembly 138 may scan underneath the electrode assembly 116.

In some embodiments, one or more magnets 196 may be positioned in the processing chamber 100. In the embodiment shown in FIG. 1, the magnets 196 are coupled to the inside surface of the sidewalls 106. In other embodiments, the magnets 196 may be positioned in other locations within the processing chamber 100 or outside the processing chamber 100. For example, the magnets 196 may be positioned within the processing chamber 100 and adjacent to the bottom 108 and/or the lid assembly 110. The magnets 196 may be, for example, permanent magnets or electromagnets. Representative permanent magnets include ceramic magnets and rare earth magnets.

In embodiments where the magnets 196 include electromagnets, the magnets 196 may be coupled to a power supply (not shown). The magnets 196 are configured to generate a magnetic field in a parallel direction, a perpendicular direction, or other direction relative to the electric field generated by electrode assembly 116 and/or the electrode assembly 118. The magnets 196 may be configured to generate a field strength across the first surface 134 of the substrate support assembly 138 of between about 0.1 Tesla (T) and about 10 T, such as between about 1 T and about 5 T. In embodiments including a magnetic field, the magnets 196 may remain stationary or move relative to the first surface 134 of the substrate support assembly 138.

Figure 2:
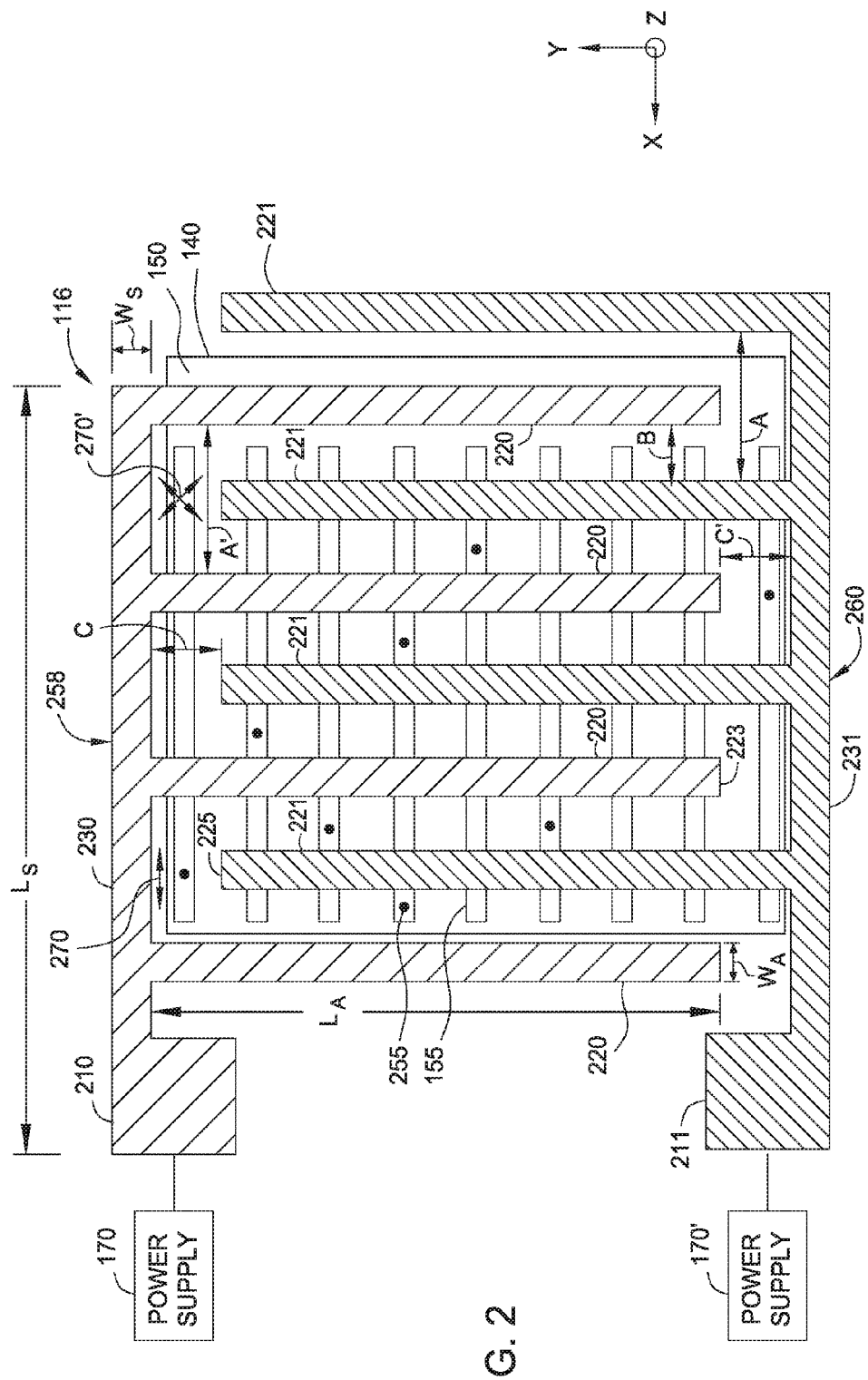
FIG. 2 illustrates a top view of embodiment of an electrode assembly of apparatus of FIG. 1 according to one embodiment described herein.

FIG. 2 illustrates a top view of one embodiment of the electrode assembly 116 of FIG. 1. In the embodiment shown in FIG. 2, the electrode assembly 116 includes at least a first electrode 258 and a second electrode 260. The first electrode 258 includes a first terminal 210, a support structure 230, and one or more antennas 220. The second electrode 260 includes a second terminal 211, a support structure 230, and one or more antennas 221. The first terminal 210, the support structure 230, and the one or more antennas 220 of the first electrode 258 may form a unitary body. Alternatively, the first electrode 258 may include separate portions that may be coupled together. For example, the one or more antennas 220 may be detachable from the support structure 230. The second electrode 260 may similarly be a unitary body or be comprised of separate detachable components. The first electrode 258 and the second electrode 260 may be prepared by any suitable methods. For example, the first electrode 258 and the second electrode 260 may be fabricated by machining, casting, or additive manufacturing.

In one embodiment, the support structure 230 may be made from a conductive material, a semiconductive material, or substantially non-conductive materials. For example, the support structure 230 may be made of one or more of silicon, polysilicon, silicon carbide, molybdenum, aluminum, copper, graphite, silver, platinum, gold, palladium, zinc, other materials compatible with processing conditions in the chamber 100, or mixtures thereof. The support structure 230 may have any desired dimensions. For example, the length $L_S$ of the support structure 230 may be between about 25 mm and about 450 mm, for example, between about 100 mm and about 300 mm. In some embodiments, the support structure 230 has a length $L_S$ approximately equal to a diameter of a standard semiconductor substrate. In other embodiments, the support structure 230 has a length $L_S$ that is larger or smaller than the diameter of a standard semiconductor substrate. For example, in different representative embodiments, the length $L_S$ of the support structure 230 may be about 25 mm, about 51 mm, about 76 mm, about 100 mm, about 150 mm, about 200 mm, about 300 mm, or about 450 mm.

The width $W_S$ of the support structure 230 may be between about 2 mm and about 25 mm. In other embodiments, the width $W_S$ of the support structure 230 is less than about 2 mm or greater than about 25 mm. The thickness of the support structure 230 may be between about 1 mm and about 10 mm, such as between about 2 mm and about 8 mm, such as about 5 mm. In other embodiments the support structure may have a thickness of less than about 1 mm or greater than about 10 mm. In some embodiments, the support structure 230 may have a cross-section that is square, cylindrical, rectangular, oval, rods, or other shapes. Embodiments having round exterior surfaces may avoid arcing.

The support structure 231 may be made of the same materials as the support structure 230. Alternatively, the support structure 230 and the support structure 231 may be made of different materials. The lengths $L_S$, widths $W_S$, and thicknesses of the support structure 230 and the support structure 231 may be the same or different. The one or more antennas 220 of the first electrode 258 may also be made from a conductive material. The one or more antennas 220 may be made from the same materials as the support structure 230. Each of the antennas 220 may have the same dimensions. Alternatively, some of the one or more antennas 220 may have different dimensions than one or more of the other antennas 220. The antennas 221 may be made of the same range of materials as the antennas 220. The range of dimensions suitable for the antennas 220 is also suitable for the antennas 221.

The number of the antennas 220 may be between about 1 and about 40 antennas. For example, the number of the antennas 220 may include between about 4 and about 40, such as between about 10 and about 20. Each of the antennas 220 may be substantially parallel to each of the other antennas 220. Each of the antennas 221 may be similarly positioned with respect to the support structure 231 and each other antenna 221. In one example, the support structure 230 and the support structure 231 are straight. In other example, the support structure 230 and the support structure 231 may not be straight, such as curved, jagged, or have other profiles or shapes. In these embodiments, each of the antennas 220 may still be substantially parallel to each of the other antennas 220.

Each of the antennas 220 has a terminal end 223 and a terminal end 225. A distance C is defined between the support structure 230 and the terminal end 225. A distance C' is defined between the support structure 231 and the terminal end 223. Each of the distances C and C' may be between about 1 mm and about 10 mm. A distance A is defined between facing surfaces of one of the antennas 221 and an adjacent one of the antennas 221. The distance A' is defined between facing surfaces of one antenna 220 and an adjacent one the antennas 220. The distances A and A' may be greater than about 6 mm. A distance B is defined between facing surfaces of one of the antennas 220 and an adjacent one of the antennas 221. The distance B may be, for example, greater than about 1 mm. The strength of an electric field generated between an antenna 220 and an adjacent antenna correlates with the distance B. For example, a smaller distance B correlates with a stronger electric field. Accordingly, in embodiments where a stronger electric field is desired, a smaller distance B may be advantageous.

In operation, the power supply 170 may supply a voltage to the first terminal 210 and/or a power supply 170' may provide a voltage to the second terminal 211. The power supply 170' may be substantially similar to the power supply 170. The supplied voltage creates an electric field between each antenna of the one or more antennas 220 and each antenna of the one or more antennas 221. The electric field will be strongest between an antenna of the one or more antennas 220 and an adjacent antenna of the one or more antennas 221. The interleaved and aligned spatial relationship of the antennas 220, 221 produces an electric field in a direction parallel to the plane defined by the first surface 134 of the substrate support assembly 138.

The substrate 140 is positioned on the first surface 134 of the substrate support assembly 138 such that the latent image lines 155 are parallel to the electric field lines generated by the electrode assembly 116. Since the charged species 255 are charged, the charged species 255 are affected by the electric field. The electric field drives the charged species 255 generated by the photoacid generators in the photoresist layer 150 in the direction of the electric field. By driving the charged species 255 in a direction parallel with the latent image lines 155, line edge roughness may be reduced. The uniform directional movement is shown by the double headed arrow 270. In contrast, when a voltage is not applied to the first terminal 210 or the second terminal 211, an electric field is not created to drive the charged species 255 in any particular direction. As a result, the charged species 255 may move randomly, as shown by the arrows 270'. In other embodiments, the substrate 140 may be oriented differently relative to the antennas 220, 221. For example, the antennas 220, 221 may be parallel to the latent image lines 155.

Figure 3:
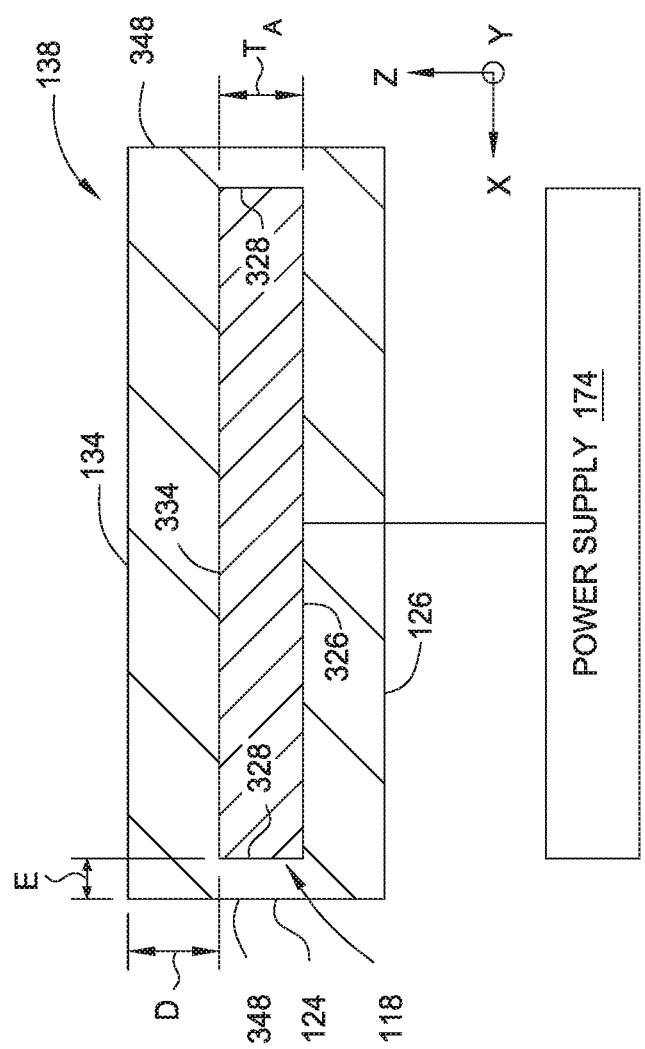
FIG. 3 illustrates a schematic, side cross-sectional view of one embodiment of the substrate support assembly of FIG. 1 having an electrode assembly embedded therein according to one embodiment described herein.

FIG. 3 illustrates a schematic, side cross-sectional view of the substrate support assembly 138 of FIG. 1 having the electrode assembly 118 embedded therein. The electrode assembly 118 is embedded between the first surface 134 and the second surface 126 of the body 124 of the substrate support assembly 138. The electrode assembly 118 has a first surface 334 and a second surface 326. The first surface 334 and the second surface 326 are opposite each other and substantially parallel to the first surface 134 of the substrate support assembly. The first surface 334 of the electrode assembly 118 is closer than the second surface 326 to the first surface 134 of the substrate support assembly 138. The distance D represents the distance separating the first surface 134 of the substrate support assembly 138 from the first surface 334 of the electrode assembly. The distance D may be between about 0.1 mm and about 100 mm. For example, the distance D may be between about 8 mm and about 14 mm. The distance D may be selected to control the strength of the electric field provided by the electrode assembly 118 to the first surface 134 and/or the photoresist layer 150. The strength of the electric field generally influences and controls the rate of diffusion of the charged species 255.

The substrate support assembly 138 has outer side surfaces 348 and the electrode assembly 118 has outer side surfaces 328. The distance E represents a rim between the outer side surfaces 328 and the outer side surfaces 348. The distance E may be, for example, any distance suitable for the distance D. The distance E may be constant around the electrode assembly 118, or the distance E may vary. The thickness of the electrode assembly 118 is represented by the distance $T_A$. The distance $T_A$ may be any suitable thickness for the antennas 220, 221 discussed above. As shown, the electrode assembly 118 is coupled to the power supply 174. The properties of the power supplied by the power supply 174 to the electrode assembly 118 may be as described above in relation to the power supply 170 of FIG. 1.

Figure 4A:
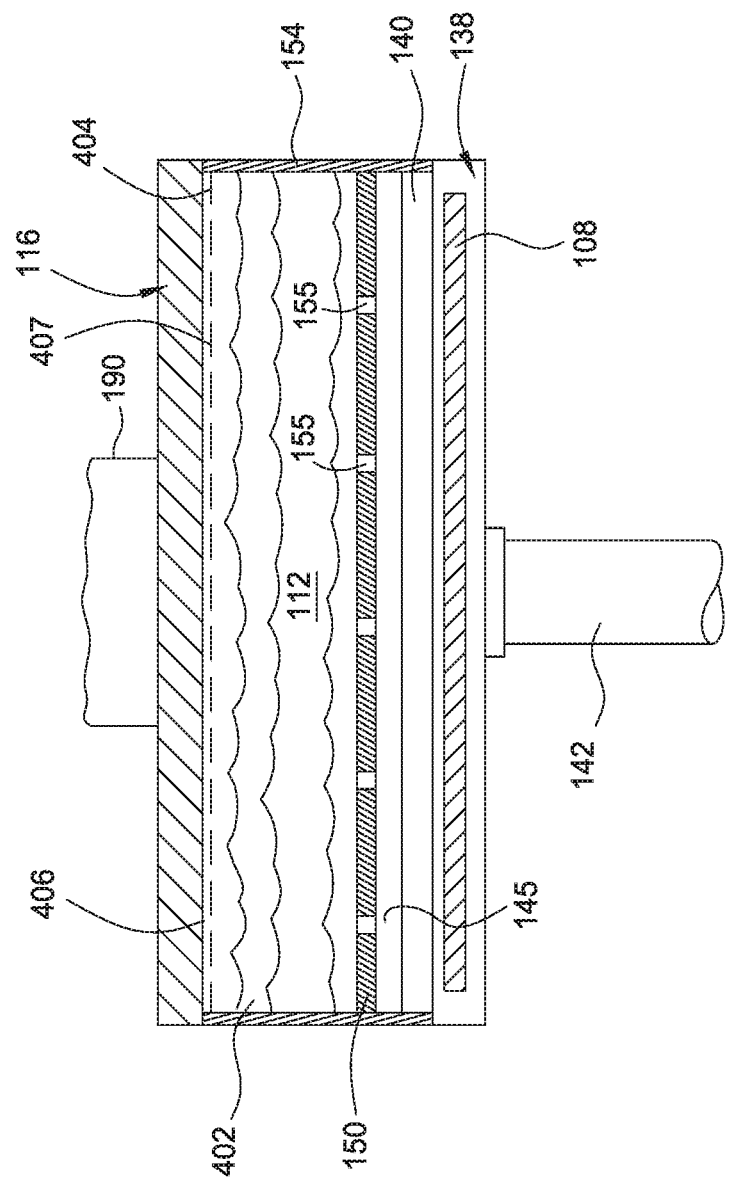
FIGS. 4A-4B are schematic illustrations representative of an intermediate medium that may be used to process a substrate according to embodiments disclosed herein.

FIG. 4A depicts one example of the substrate support assembly 138 with an intermediate medium 402 disposed in the processing volume 112 and retained by the confinement ring 154 above the substrate 140. Without the intermediate medium 402 positioned in the processing volume 112, an air gap is typically defined in the processing volume 112 between the substrate 140 and the electrode assembly 116. The dimension of the air gap defined in the processing volume 112 may be determined by the distance where the electrode assembly 116 is positioned approximate to the substrate 140. For example, when the electrode assembly 116 is positioned close to the photoresist layer 150 disposed on the substrate 140, a smaller dimension of the air gap may be defined in the processing volume 112. In contrast, when the electrode assembly 116 is positioned relatively far and distanced away from the substrate 140, a larger dimension of the air gap may be defined in the processing volume 112.

It is believed that air medium (i.e., air gap) formed in the processing volume 112 may adversely result in a voltage drop when a voltage power is applied to the electrode assemblies 116, 118. As the dielectric constant in the substrate 140 and in the air are very different, e.g., approximately 11.7 for the substrate 140 and 1 for air, when the voltage supplied to the electrode assembly 116 to generate an electric field to the substrate 140, a significant voltage drop is often observed when voltage is transmitting through the air gap formed in the processing volume 112 prior to reaching to the photoresist layer 150 disposed on the substrate 140. It is believed the low dielectric constant in air, e.g., dielectric constant of 1, significantly changes the voltage level applied from the electrode assembly 116. Thus, by inserting a material with relatively high dielectric constant, such as greater than about 10, to replace the air gap defined in the processing volume 112, the voltage applied to form the electric field therein may be maintained at a desired level without significant loss until reaching to the photoresist layer 150 disposed on the substrate 140.

In one example, intermediate medium 402 placed in the processing volume may be liquid solution, such as DI water, organic gel, organic solution, inorganic solution, or other suitable medium that has a suitable dielectric constant configured to maintain the voltage level transmitting therethrough without significant voltage drop. In one example, DI water, e.g., a material having a dielectric constant about 80, is disposed and placed in the processing volume 112 above the substrate support assembly 138 confined by the confinement ring 154. In other embodiments, the intermediate medium 402 may be a material which is compatible (i.e. does not solvate the photoresist layer 150, or solvates the photoresist layer 150 at a rate which does not significantly affect patterning) with the photoresist layer 150. As previously mentioned, the intermediate medium 402 has a dielectric constant which prevents or reduces a voltage drop between the electrode assemblies 116, 118.

In one example, the intermediate medium 402 may be supplied from the intermediate medium source 172 through the intermediate medium dispensing tool 173 to substantially fill the processing volume 112. The intermediate medium 402 disposed in the processing volume 112 may create an interface 404 in a close approximation to a downward surface 406 of the electrode assembly 116. After the intermediate medium source 172 is filled in the processing volume 112, the electrode assembly 116 may be lowered down to keep a minimum or negligible distance 407 between the electrode assembly 116 and the intermediate medium source 172. As a result, the likelihood of voltage drop caused by the low dielectric constant air gap may be completely or substantially reduced.

Figure 4B:
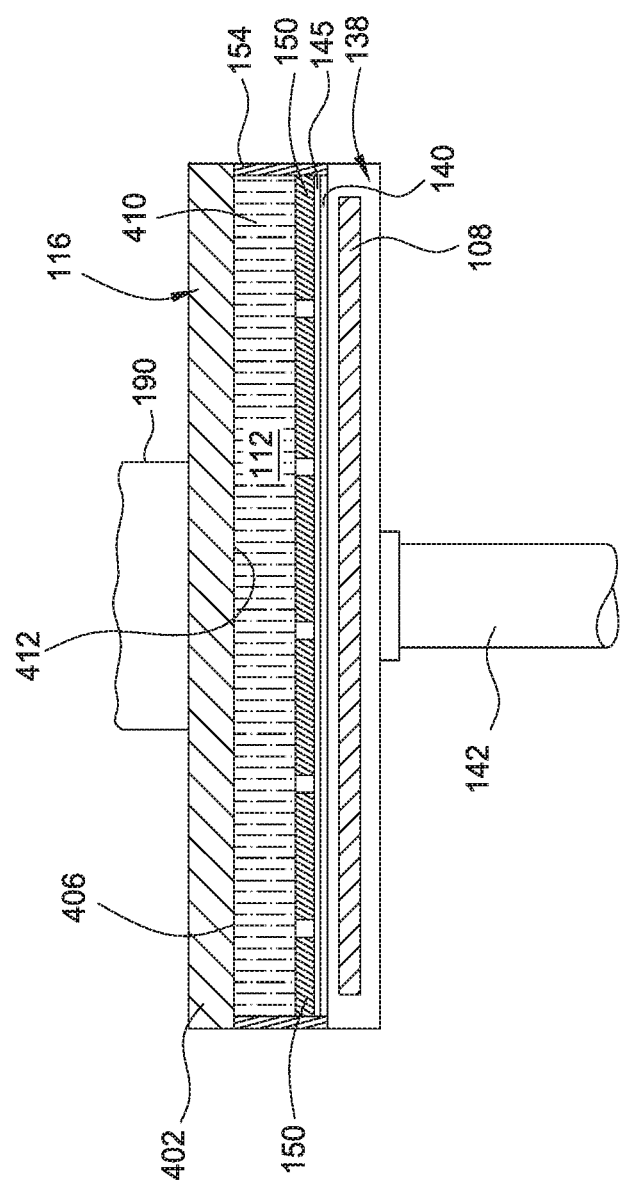

Materials other than DI water may also be utilized as the intermediate medium source 172 to fill in the region of the processing volume 112 confined by the confinement ring 154, as shown in FIG. 4B. In the example depicted in FIG. 4B, a gel or flowable organic droplets 410 with a dielectric constant greater than about 9 may also be used to fill the air gap disposed in the processing volume 112. The gel or flowable organic droplets 410 may be spun-on to the substrate 140 until an interface 412 of the gel or flowable organic droplets 410 is defined in a close approximation to the downward surface 406 of the electrode assembly 116 with minimum and/or negligible room for an air gap. A quantity of the gel or flowable organic droplets 410 needed to fill the air gap defined above the substrate support assembly 138 and confined by the confinement ring 154 depends on the geometry of those components. It is noted that the gel or flowable organic droplets 410 may be continuously added until the processing volume 112 above the substrate is substantially full without leaving an undesired air gap touching the surface of the substrate 140.

Figure 5A:
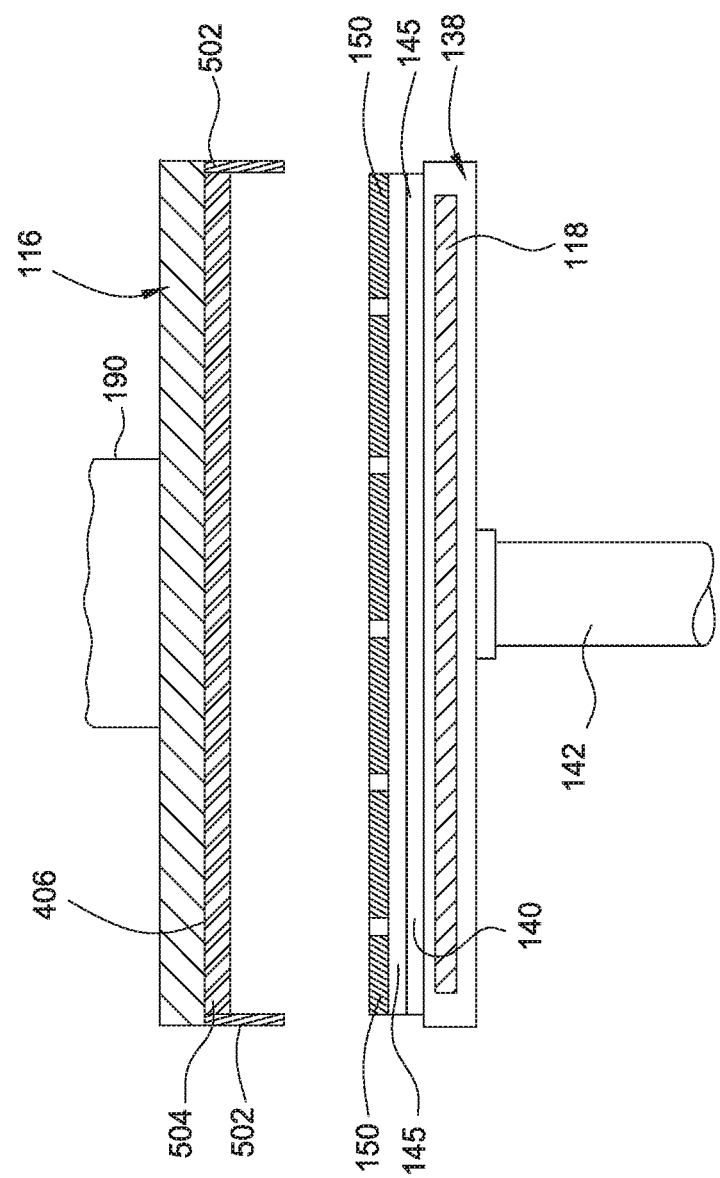
FIGS. 5A-5B are schematic illustrations representative of an intermediate medium that may be used to process a substrate according to embodiments disclosed herein.
Figure 5B:
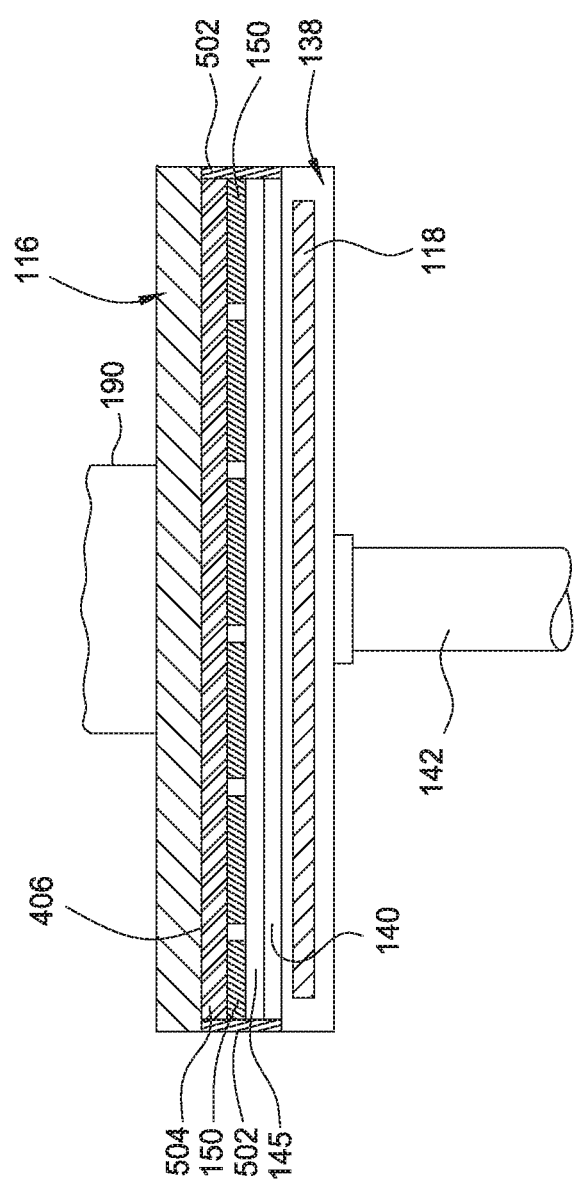

FIG. 5A depicts another embodiment of the electrode assembly 116 with a confinement ring 502 disposed on an edge of the electrode assembly 116 from its downward surface 406. Instead of liquid medium, a solid state medium 504 may be utilized to be positioned below and in contact with the downward surface 406 of the electrode assembly 116 within the area confined by the confinement ring 502. After the solid state medium 504 is in place, the electrode assembly 116 may then be lowered down by the actuator 190 to have the solid state medium 504 in contact with the photoresist layer 150 disposed on the substrate 140, as shown in FIG. 5B. By carefully selecting the qualities and properties of the solid state medium 504, e.g., with desired dielectric constant, the solid state medium 504 enables maintenance of a desired voltage for electric field generation between the electrode assemblies 116, 118.

In one example, the solid state medium 504 may be a solid disk having a size that may covers an entire surface of the photoresist layer 150 disposed on the substrate 140. The solid state medium 504 may be attached to the electrode assembly 116 by any suitable techniques, including mechanical bonding or chemical bonding. The solid state medium 504, when positioned above the photoresist layer 150, may be placed in a position confined by the confinement ring 502 in close approximation to the photoresist layer 150 with minimum and/or negligible room for an air gap. It is noted that the phrase "negligible room" as described here may be a space less than 10 micrometers in height. In one example, the solid state medium 504 may be fabricated from a material with high a dielectric constant greater than about 10. Suitable examples of the solid state medium 504 include quartz or $TiO_2$, among others.

FIG. 6 illustrates a processing system 600 that may be used to process a substrate according to embodiments disclosed herein. As shown, the processing system 600 includes a load port 610, a coating chamber 620, a processing chamber 100, an exposure chamber 630 (such as a scanner), a second processing chamber 100, a development chamber 640, and a post-processing chamber 650. Each chamber of the processing system 600 is coupled to each adjacent chamber by a transfer chamber 605 or a transfer chamber 615. The transfer chambers 605 and the transfer chamber 615 may be substantially similar or different.

The load port 610 may be used to introduce or remove substrates into or out of the processing system 600. The coating chamber 620 may be used, for example, for applying a photoresist to a substrate. The coating chamber 620 may be, for example, a spin coater. The exposure chamber 630 may be used for exposing the substrate to electromagnetic energy in order to form a latent acid image in a photoresist layer on a substrate. The development chamber 640 may be used, for example, for removing portions of the photoresist layer. The post-processing chamber 650 may be used, for example, to perform a variety of post-processing steps on a substrate. The processing chamber 100 may be used for a pre-exposure bake, a post-exposure bake, and/or other processing steps. As described above, the processing chamber 100 may include one or more electrode assemblies 118, a remote plasma source 160, and magnets 196. However, it is to be understood that the coating chamber 620, the exposure chamber 630, and the development chamber 640 may also be similarly equipped.

Figure 7:
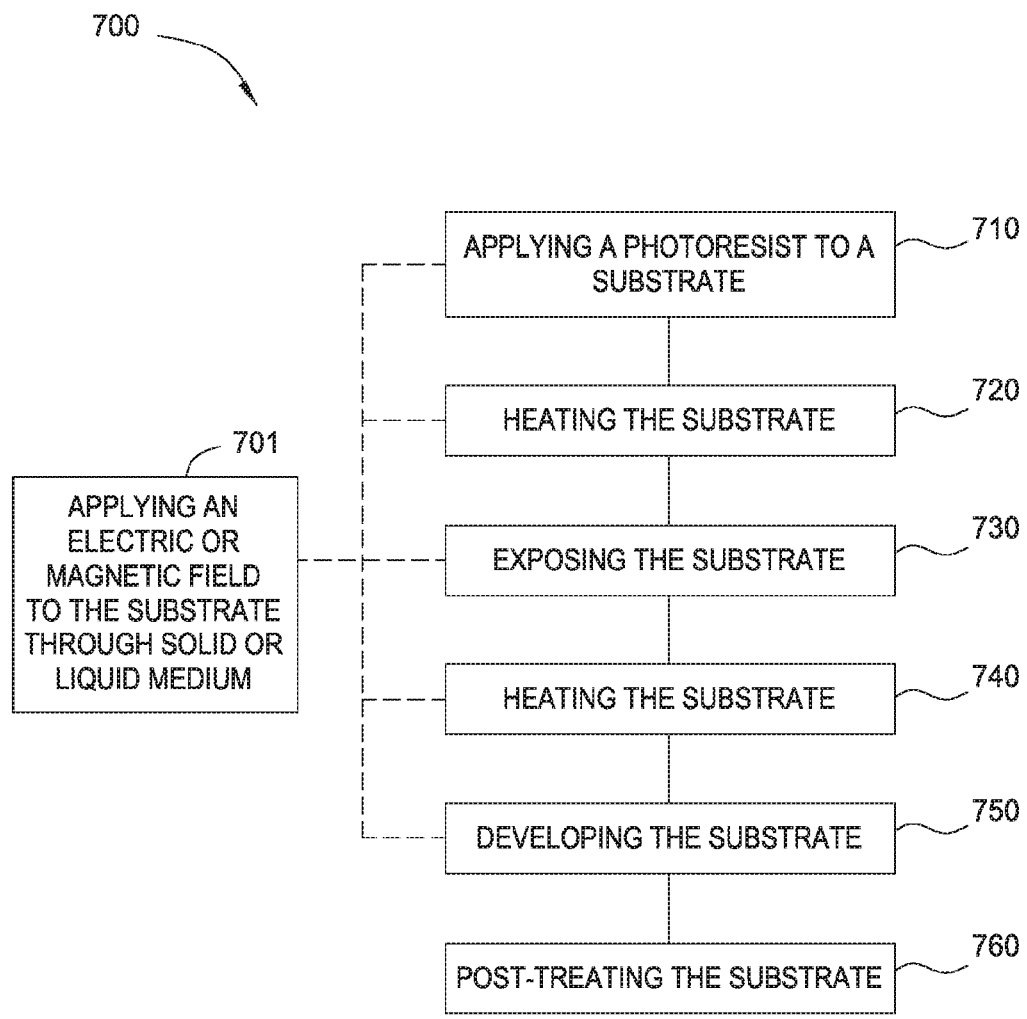
FIG. 7 illustrates a flow diagram of a method of processing a substrate according to one embodiment described herein.

FIG. 7 is a flow diagram of a method 700 for processing a substrate, such as the substrate 140. The method 700 for processing the substrate 140 includes multiple operations. The operations can be performed in any order, for example, sequentially, simultaneously, or any other desired order (except where the context excludes that possibility). The method can also include one or more other operations which are carried out before any of the defined operations, between two of the defined operations, or after all the defined operations (except where the context excludes that possibility). Not all embodiments may include all the operations.

At operation 710, a photoresist is applied to the substrate 140 to form a photoresist layer 150. The photoresist layer 150 may be applied by, for example, by spin coating inside a spin coating apparatus, such as the coating chamber 620 included in the processing system 600. In such an embodiment, the substrate 140 may enter the processing system 600 through the load port 610 and thereafter be transferred to the coating chamber 620 through a transfer chamber 605.

The photoresist material comprising the photoresist layer 150 may include a solvent, a photoresist resin, and a photoacid generator. The photoresist resin may be any positive photoresist resin or any negative photoresist resin. Representative photoresist resins include acrylates, novolacs resins, poly(methylmethacrylates), and poly(olefin sulfones). Other photoresist resins may also be used.

Prior to the photoresist layer 150 being exposed to electromagnetic radiation, the photoacid generator generates charged species 255, such as an acid cation and an anion. The photoacid generator may also generate polarized species. The photoacid generator sensitizes the resin to electromagnetic radiation. Representative photoacid generators include sulfonate compounds, such as, for example, sulfonated salts, sulfonated esters, and sulfonyloxy ketones. Other suitable photoacid generators include onium salts, such as aryl-diazonium salts, halonium salts, aromatic sulfonium salts and sulfoxonium salts or selenium salts. Other representative photoacid generators include nitrobenzyl esters, s-triazine derivatives, ionic iodonium sulfonates, perfluoroalkanesulfonates, aryl triflates and derivatives and analogs thereof, pyrogallol derivatives, and alkyl disulfones. Other photoacid generators may also be used.

At operation 720, the substrate 140 is then heated by a pre-exposure baking process. During the pre-exposure baking process, the substrate is heated to partially evaporate the photoresist solvents. The pre-exposure bake at operation 720 and the photoresist application at operation 710 may occur in the same chamber or in different chambers. For example, both operations 710, 720 may occur in a spin coater or the substrate 140 may be transferred to a different processing chamber between operations 710, 720. In an embodiment using the processing system 600, the substrate 140 may be transferred from the coating chamber 620 to the processing chamber 100 through the transfer chamber 605.

At operation 730, the substrate 140 then transferred to the exposure chamber 630 to expose substrate 140 to electromagnetic radiation for a lithographic exposure process. The substrate 140 and portions of the photoresist layer 150 are exposed to electromagnetic radiation. During exposure, portions of the photoresist layer 150 are selectively exposed and portions of the photoresist layer 150 are selectively unexposed. Portions of the photoresist layer 150 exposed to electromagnetic radiation may have different chemical properties than the portions of the photoresist layer 150 not exposed to the electromagnetic radiation.

The charged species 255 generated by the photoacid generator generally result in a latent acid image in the resist resin. In some embodiments, a photomask or reticle may be positioned between the photoresist layer 150, and the photoresist layer 150 may be exposed to electromagnetic radiation through the mask or reticle. The mask or reticle may be configured to transfer a pattern containing lines to the photoresist layer 150. In other embodiments, a pattern containing lines may be transferred to the photoresist layer 150 using maskless lithography techniques. The transferred latent image lines 155 may have any desired length, width, and spacing between latent image lines 155. For example, in some embodiments, the line widths and line spacing may be between about 10 nm and about 16 nm. In other embodiments, the line widths and spacing may be less than about 10 nm or greater than about 16 nm. In some embodiments, the length of the latent image line 155 is about 150% of the width of the latent image line 155. In other embodiments, the length of the latent image line 155 is greater than about 200% of the width of the latent image line 155, such as for example, greater than about 1000% of the width of the latent image line 155.

The electromagnetic radiation generally has a wavelength suitable for exposing the photoresist layer 150. For example, the electromagnetic radiation may have a wavelength in the extreme ultra violet (EUV) range, such as between about 10 nm and about 124 nm. In other embodiments, the electromagnetic radiation may be generated by an argon fluoride laser. In such an embodiment, the electromagnetic radiation may have a wavelength of about 193 nm. In some embodiments, the wavelength may be 248 nm. Other embodiments may use different wavelengths. In some embodiments, the electromagnetic radiation is from an electron beam or an ion beam.

After exposure, at operation 740, the substrate 140 is heated in a post-exposure bake stage during a post-exposure baking process to change the film properties exposed under electromagnetic radiation at operation 740. The substrate 140 may be transferred from the exposure chamber 630 to the processing chamber 100 through the transfer chamber 615 for the post-exposure baking process. The substrate 140 may be positioned on the first surface 134 of the substrate support assembly 138 during the post-exposure baking process. The power supply 174 may provide power to the embedded heater 132 to heat the substrate 140 during the post-exposure baking process. The embedded heater 132 may quickly heat the substrate 140 and the photoresist layer 150. For example, the embedded heater 132 may raise the temperature of the photoresist layer 150 from ambient temperature to between about 70° C. and about 160° C., such as between about 90° C. and 140° C., in less than about 2 seconds.

During the post-exposure bake at operation 740, photoacid generators in the photoresist layer 150 may continue to alter the chemical properties of the exposed portions of the photoresist layer 150. In addition to the baking process, an electrical field may be generated to the photoresist layer 150, as described at operation 701, while performing the post-exposure baking process at operation 740. While applying the electric field between the electrode assembly 116 and/or the electrode assembly 118, the charged species 255 may be guided in a desired direction by at least one of an electric field, a magnetic field, and/or a plasma. The magnetic field may be generated by, for example, the magnets 196. The plasma may be generated by, for example, the remote plasma source 160. With the utilization of intermediate medium 402, gel or flowable organic droplets 410 or the solid state medium 504 in the processing volume 112, the likelihood of voltage drop/loss applying to the electrode assemblies 116, 118 for electric field generation may be significantly reduced or eliminated. While generating the electric field to the photoresist layer 150, the substrate 140 may or may not have a relative motion to the electrode assemblies 116, 118 as needed to alter the electric field strength at different locations of the photoresist layer 150.

As noted above, the charged species 255 may be guided in any operation or in any combination of operations. In some embodiments, the charged species 255 are guided in one direction relative to the latent image lines 155 in one operation and guided in another direction relative to the latent image lines 155 in another operation. For example, during the exposure operation 730, the charged species 255 may be guided in a direction perpendicular to the first surface 134, and during the post-exposure bake operation 740, the charged species 255 may be guided in the direction of the latent image lines 155 or both in the direction of the latent image lines 155 and in a direction perpendicular to the first surface 134. In another embodiment, the charged species may be guided in the direction of the latent image lines 155 or both in the direction of the latent image lines 155 and in a direction perpendicular to the first surface 134 during the exposure operation 730 and guided in a direction perpendicular to the first surface 134 during the post-exposure bake at operation 740. In some embodiments, the charged species 255 may be guided in different directions within a single phase. For example, in an exposure operation or during a post-exposure bake operation, the charged species 255 may be guided in a direction perpendicular to the first surface 134 for a portion of the stage and guided in a direction perpendicular to the first surface 134 and in a direction along the direction of the latent image lines for a portion of the stage. Such a variation in guided direction may be achieved by toggling the magnetic field on and off while applying a vertical magnetic field.

Figure 9:
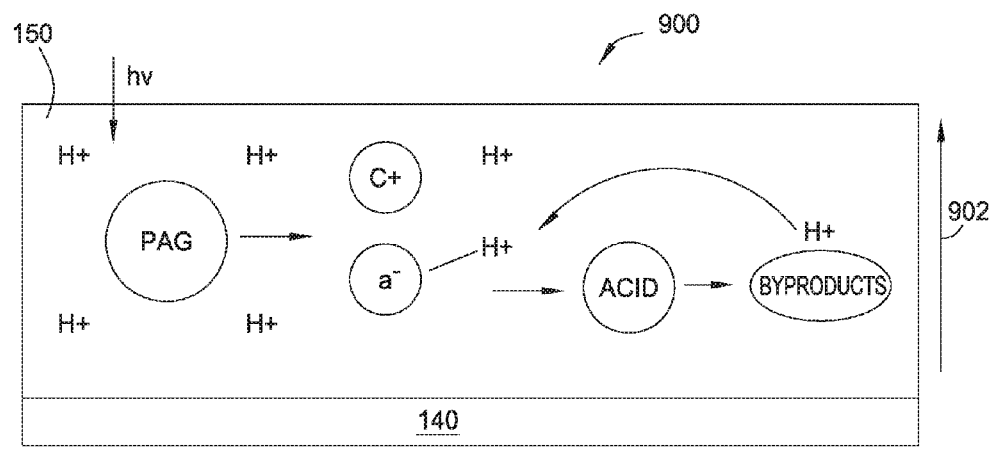
FIG. 9 schematically illustrates a mechanism of acid regeneration in a photoresist according to embodiments described herein.

Referring now to FIG. 9, an acid regeneration mechanism 900 is schematically represented to illustrate advantageous embodiments of the method 700 described herein. As described above with regard to operation 730, the substrate 140 may be exposed to ionize the photoresist and the photoacid generator (PAG) generates cations ($c^+$) and anions ($a^-$). The ionization of the photoresist layer 150 may also result in the formation of protons (i.e. H+). The anions and cations dissociated from the PAG are generally relatively large compounds and do not readily move through the photoresist layer matrix. However, the protons are generally relatively small molecules and may move more quickly (i.e.

relative to the cations/anions) throughout the photoresist layer matrix. Generally, the mechanism of acid generation is believed to proceed by protonation of the anion. As a result, acid generation in the photoresist layer 150 is generally limited by the availability of anions within the matrix.

Because electromagnetic radiation is generally exposed to the photoresist layer 150 in a top-down process, regions of the photoresist layer 150 adjacent the substrate 140 may not have adequate amounts of dissociated PAG to facilitate deprotection of the photoresist layer 150. In other words, a gradient of cations/anions may exist in the photoresist layer 150. For example, a higher concentration of cations/anion is present near a surface of the resist being exposed when compared to a region of the resist adjacent the substrate 140. By actively influencing anion movement within the photoresist layer 150, deprotection via acid generation may be achieved more quickly and with improved selectivity.

Operation 701 may be utilized to apply a field 902 to the substrate 140 and photoresist layer 150. In one embodiment, the field 902 may have a positive polarity configured to facilitate movement of anions within the photoresist layer matrix. For example, the field may be oriented "up" to drive negatively charged anions toward the substrate 140. Accordingly, anions may be moved through the matrix towards the substrate 140 where additional protons exist. As a result, the cation/anion concentration gradient may be changed by application of the field. As noted above, due to the mobility of protons within the matrix, the protons may be present in greater concentrations where acid formation is not readily occurring (due to the lack of anion for acid generation). As the acid is generated, byproducts of the resist solvation are generated by deprotecting the photoresist, in addition to protons which may be re-utilized to protonate anions. Accordingly, it is believed the acid regeneration mechanism 900 may be facilitated according to the embodiments described herein.

As a result of anions being moved through the matrix, acid may be generated more readily. Thus, deprotection in a desired pattern may be achieved in a more efficient and controlled manner. Similarly, sensitivity of the resist may also be improved by influencing the speed of acid regenerations and location where acid is regenerated. Moreover, line edge roughness and line width roughness may be reduced via anion movement and subsequent acid generation and regeneration.

In addition, contrast of the photoresist layer 150 may also be improved according to the embodiments described herein. The contrast of the photoresist may generally be defined as the development rate of the resist as a function of the absorbed light dose. In other words, the contrast of the photoresist is the ability of the resist to distinguish between "light" and "dark" regions. For example, the latent image lines 155 may be considered "light" regions because those regions were exposed to light during exposure in operation 130. By improving the contrast, improved resolution may be achieved which results in an improved resist verticality profile. For example, footings may be reduced or eliminated and more precise patterning at advanced technology nodes may be realized utilizing the methods described herein.

Figure 8:
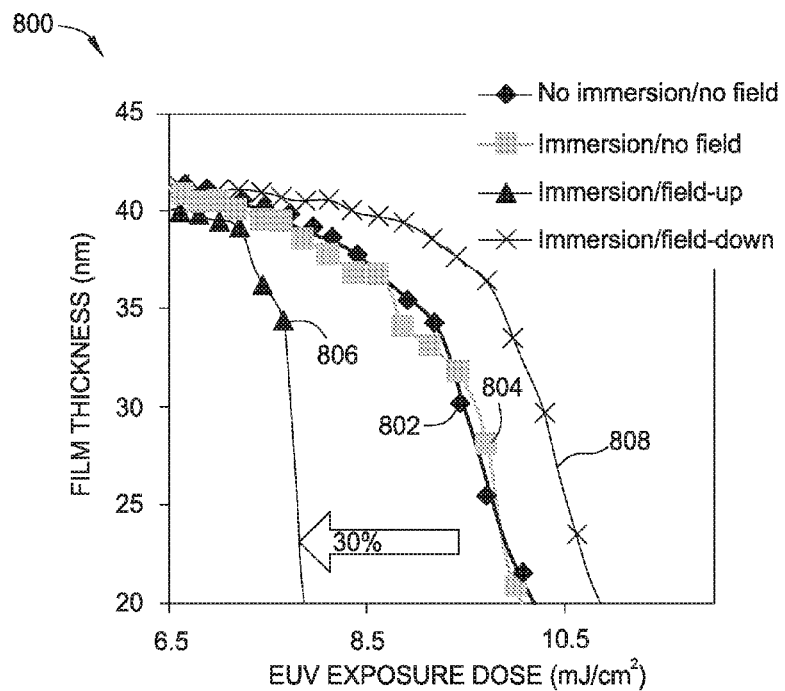
FIG. 8 is a graph illustrating dose sensitivity of a photoresist according to embodiments described herein.

Referring now to FIG. 8, a graph 800 illustrating resist film thickness as a function of electromagnetic energy dosage in post-exposure processes is provided. Data 802 is representative of a photoresist layer 150 upon which no immersion/no field is applied. Data 804 is representative of a photoresist layer 150 upon which an immersion lithography process was performed but no field was applied. Data 808 is representative of a photoresist layer 150 upon which immersion lithography was performed and a "downward" field was applied. Data 806 is representative of a photoresist layer 150 upon which immersion lithography was performed and an "upward" field was applied. Accordingly, it can be seen that data 806 with immersion/field-up provides adequate film thickness reduction as a greatly reduced exposure dosage when compared to conventional and other field guided/immersion processes. For example, the immersion/field-up process may reduce the exposure dosage by about 30% in certain embodiments.

By utilizing the embodiments described herein, the immersion/field-up process may enable lower dose utilization while maintaining adequate resist solvation. Accordingly, this may result in a greater contrast in the photoresist layer 150. In one example, a 500% improvement in the contrast of the photoresist layer 150 was enabled utilizing the immersion/field-up process when compared to data 802 and 808. As such, a steeper intensity transition (i.e. light/dark distinguishment) may be realized which may result in improved edge definition in the resist patter.

Subsequently, at operation 750, a development process is performed to the areas exposed or not exposed to electromagnetic radiation from the substrate 140 to develop the photoresist layer 150. In one embodiment, after operation 740, the substrate 140 is transferred to a develop chamber, such as the develop chamber 640 depicted in FIG. 6. In embodiments using the processing system 600, the substrate 140 may be transferred from the processing chamber 100 to the development chamber 640 through the transfer chamber 605. The development chamber 640 may also include the electrode assembly 116 coupled to one or more power supplies and/or the actuator 190 and magnets 196. The substrate 140 may be positioned in the development chamber 640 relative to the electrode assembly 116 and magnets 196 as described in relation to the coating chamber 620.

During operation 750, the photoresist layer 150 may be developed by, for example, exposing the photoresist layer 150 to a developer, such as a sodium hydroxide solution, a tetramethylammonium hydroxide solution, xylene, or organic developers, such as alcohols or the like. The substrate 140 may be rinsed with, for example, water or n-butylacetate. After the development process at operation 750, the latent image lines 155 may no longer be latent. The lines 155 on the substrate 140 will have less line edge/width roughness compared to conventional techniques. In addition, as a result of improved resist contrast, pattern verticality profiled may also be significantly improved.

Subsequently, at operation 760, a post-treatment process may be performed on the substrate 140 to post-treat the substrate after the development process. The post-processing process may be performed, for example, in the post-processing chamber 650 depicted in FIG. 6. In an embodiment using the processing system 600, the substrate 140 may be transferred from the development chamber 640 through the transfer chamber 605 to the post-processing chamber 650 for post-processing. For example, after rinsing, the substrate 140 may be hard baked and inspected. After inspection, an etching process may be performed on the substrate 140. The etching process uses the features of photoresist layer 150, such as the lines 155, to transfer a pattern to the layer 145.

While performing the processes of applying the photoresist layer on the substrate at operation 710, heating the substrate at operation 720, exposing the substrate to electromagnetic radiation at operation 730, heating the substrate at operation 740, developing the substrate at operation 750, and post-treating the substrate at operation 760, a voltage may be applied to generate an electric field, as indicated at operation 701, to guild the charged species 255 generated by the photoacid generator in a desired direction, such as a direction parallel to the x-y plane and in the direction of the latent image lines 155, a direction parallel to the x-y plane and perpendicular to the latent image lines 155, a different direction, or combinations thereof. With the intermediate medium 402, the gel or flowable organic droplets 410 or the solid state medium 504 placed in between the electrode assembly 116 and the substrate 140 to avoid possible air gap defined therebetween, voltage applied thereto to generate the electric field may then be maintained at a desired level without undesired voltage drop or loss.

The previously described embodiments have many advantages, including the following. For example, the embodiments disclosed herein may reduce or eliminate voltage drop/loss while applying an electric field between an electrode assembly and a photoresist layer disposed on a substrate for line edge/width roughness reduction. In addition, resist sensitivity and contrast may be improved which may result in reduces line edge roughness and line width roughness.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method comprising:
    positioning a substrate having a photoresist layer disposed thereon in an exposure chamber;
    exposing the substrate having a photoresist layer disposed thereon to electromagnetic radiation to form latent image lines on the substrate, wherein the photoresist layer includes a photoacid generator;
    dissociating the photoacid generator to form charged species within the photoresist layer;
    during the exposing a substrate to electromagnetic radiation, guiding the charged species in a direction perpendicular to a surface of the substrate;
    transferring the substrate from the exposure chamber to a post-exposure bake chamber;
    heating the substrate in the post-exposure bake chamber; and
    while heating the substrate in the post-exposure bake chamber, applying an electromagnetic field to the substrate via a non-gas phase medium to guide the charged species in a direction parallel to the latent image lines.

2. The method of claim 1, wherein the non-gas phase medium comprises a material with a dielectric constant greater than about 10.

3. The method of claim 1, wherein the non-gas phase medium comprises a liquid medium or gel medium.

4. The method of claim 3, wherein the non-gas phase medium is selected from one or more of deionized water, an organic gel, an organic solution, and an inorganic solution.

5. The method of claim 1, wherein the non-gas phase medium comprises a solid state medium.

6. The method of claim 5, wherein the solid state medium is a quartz material, a titanium dioxide material, or combinations thereof.

7. The method of claim 1, wherein the applying the electromagnetic field comprises:
    generating a voltage potential of between about 40 V and about 4000 V between a first electrode assembly and a second electrode assembly, wherein the substrate is positioned between the first electrode assembly and the second electrode assembly.

8. A substrate processing method comprising:
    positioning a substrate having a photoresist layer disposed thereon in an exposure chamber;
    exposing the substrate having a photoresist layer disposed thereon to electromagnetic radiation to form latent image lines on the substrate, wherein the photoresist layer includes a photoacid generator;
    dissociating the photoacid generator to form charged species within the photoresist layer;
    during the exposing a substrate to electromagnetic radiation, guiding the charged species in a direction parallel with the latent image lines;
    transferring the substrate from the exposure chamber to a post-exposure bake chamber;
    heating the substrate in the post-exposure bake chamber; and
    while heating the substrate in the post-exposure bake chamber, applying an electromagnetic field to the substrate via a non-gas phase medium to guide the charged species in a direction perpendicular to a surface of the substrate.

9. The method of claim 8, wherein the charged species are guided by electrons generated by a plasma.

10. The method of claim 9, wherein the plasma is generated by a remote plasma source.

11. The method of claim 8, wherein the charged species are guided by a field generated by magnets.

12. The method of claim 11, wherein the magnets are one or more of ceramic permanent magnets, rare earth permanent magnets, and electromagnets.

13. The method of claim 8, wherein the applying the electromagnetic field comprises:
    generating a voltage potential between a first electrode assembly and a second electrode assembly, wherein the substrate is positioned between the first electrode assembly and the second electrode assembly.

14. A substrate processing method comprising:
    positioning a substrate having a photoresist layer disposed thereon in an exposure chamber;
    exposing the substrate having a photoresist layer disposed thereon to electromagnetic radiation to form latent image lines on the substrate, wherein the photoresist layer includes a photoacid generator;
    dissociating the photoacid generator to form charged species within the photoresist layer;
    transferring the substrate from the exposure chamber to a post-exposure bake chamber;
    positioning the substrate between a first electrode assembly and a second electrode assembly;
    filling a volume between the first electrode assembly and the second electrode assembly with a non-gas phase medium;
    heating the substrate in the post-exposure bake chamber;
    while heating the substrate in the post-exposure bake chamber, applying a first electromagnetic field to the substrate to guide the charged species in a direction parallel to the latent image lies on the substrate; and
    applying a second electromagnetic field to the substrate to guide the charged species in a direction perpendicular to a surface of the substrate.

15. The method of claim 14, wherein the non-gas phase medium is a liquid medium selected from one or more of deionized water, an organic gel, an organic solution, and an inorganic solution.

16. The method of claim 14, wherein the non-gas phase medium is a solid state medium selected from one or more of a quartz material, a titanium dioxide material, and combinations thereof.

17. The method of claim 14, wherein the first electromagnetic field is generated by magnets.

18. The method of claim 17, wherein a field strength of the first electromagnetic field generated by the magnets is between about 1 Tesla and about 5 Tesla.

19. The method of claim 17, wherein the second electromagnetic field is generated by the first electrode assembly and the second electrode assembly.

20. The method of claim 19, wherein a voltage potential of between about 40 V and about 4000 V is generated between the first electrode assembly and the second electrode assembly.

* * * * *